(12) United States Patent
Rice

(10) Patent No.: US 10,631,434 B2
(45) Date of Patent: Apr. 21, 2020

(54) SELF-PRIMING THERMOSYPHON

(71) Applicant: J R Thermal LLC, Austin, TX (US)

(72) Inventor: Jeremy Rice, Austin, TX (US)

(73) Assignee: J R Thermal LLC, Austin, TX (US)

( * ) Notice: Subject to any disclaimer, the term of this patent is extended or adjusted under 35 U.S.C. 154(b) by 172 days.

(21) Appl. No.: 15/886,550

(22) Filed: Feb. 1, 2018

(65) Prior Publication Data

US 2018/0220554 A1 Aug. 2, 2018

Related U.S. Application Data

(60) Provisional application No. 62/453,033, filed on Feb. 1, 2017.

(51) Int. Cl.
*H05K 7/20* (2006.01)
*F28D 15/02* (2006.01)
*H01L 23/427* (2006.01)

(52) U.S. Cl.
CPC ......... *H05K 7/20327* (2013.01); *F28D 15/02* (2013.01); *F28D 15/0266* (2013.01); *F28D 15/0275* (2013.01); *H01L 23/427* (2013.01); *H05K 7/208* (2013.01); *H05K 7/2029* (2013.01); *H05K 7/20245* (2013.01); *H05K 7/20872* (2013.01); *H05K 7/20936* (2013.01); *H05K 7/20981* (2013.01)

(58) Field of Classification Search
CPC ........... H05K 7/20327; H05K 7/20245; H05K 7/208; H05K 7/20872; H05K 7/20936; H05K 7/20981; F28D 15/0266; F28D 15/0283; F28D 15/02; F28D 15/0275; H01L 23/427

USPC .............................................................. 62/56
See application file for complete search history.

(56) References Cited

U.S. PATENT DOCUMENTS

| | | | | |
|---|---|---|---|---|
| 7,231,961 B2 * | 6/2007 | Alex | .................. | F28D 15/0266 165/104.33 |
| 7,958,935 B2 * | 6/2011 | Belits | .................. | F28D 15/0266 165/104.21 |
| 8,345,425 B2 * | 1/2013 | Toyoda | .............. | F28D 1/05366 165/104.26 |
| 8,929,073 B2 * | 1/2015 | Suzuki | .................. | H01L 23/427 165/104.21 |

(Continued)

*Primary Examiner* — Henry T Crenshaw
(74) *Attorney, Agent, or Firm* — DuBois, Bryant & Campbell, LLP; William D. Wiese

(57) ABSTRACT

A thermosyphon having an evaporator, a condenser having a condenser liquid pool accumulated at the bottom thereof creating a condenser liquid pool surface, a vapor tube fluidly coupling the evaporator to the condenser, and a liquid tube fluidly coupling the condenser to the evaporator, wherein the liquid tube apex is above the condenser liquid pool surface, thereby trapping vapor and preventing liquid from passing from the condenser to the evaporator. The application of heat to the evaporator increases the total system internal temperature and pressure causing condensation of the vapor in the liquid tube. As the liquid level in the liquid tube increases above the lower interior surface of the apex of the liquid tube, the liquid tube is primed thereby creating the pressure head needed to overcome the hydrodynamic losses inside the thermosyphon. Various embodiments allow passive start-up, regardless of the initial distribution of liquid inside the thermosyphon.

13 Claims, 4 Drawing Sheets

(56) References Cited

U.S. PATENT DOCUMENTS

2002/0074108 A1* 6/2002 Khrustalev ......... F28D 15/0266
                                                  165/104.26
2004/0037045 A1* 2/2004 Phillips ............... F28D 15/0266
                                                  361/719

* cited by examiner

SELF-PRIMING THERMOSYPHON

PRIORITY STATEMENT UNDER 35 U.S.C. § 119 & 37 C.F.R. § 1.78

This non-provisional application claims priority based upon prior U.S. Provisional Patent Application Ser. No. 62/453,033 filed Feb. 1, 2017, in the name of Jeremy Rice entitled "SELF-PRIMING THERMOSYPHON," the disclosures of which are incorporated herein in their entirety by reference as if fully set forth herein.

BACKGROUND OF THE INVENTION

Passive heat transfer devices are of much interest in applications such as electronics cooling. Heat pipes are one such device which are commonly used. They are a liquid and vapor device in which liquid is pumped through capillarity from the condenser to the evaporator. The pumping effect in this device requires a wick, which produces a high pressure loss, limits the maximum heat transport distance and/or power that can be supported before dry-out occurs.

Another technology node that is useful is a thermosyphon, as shown in FIG. 1. In operation, liquid is vaporized in an evaporator 101. The vapor then travels through a vapor tube 102 to the condenser 100. Heat is removed from the condenser 100 causing the liquid 104 to accumulate at the bottom. The accumulated liquid 104 in the condenser 100 is driven by gravity through a liquid tube 103 back to the evaporator 101. The evaporators in these devices are typically pool boiling devices with an enhanced surface 105 that may consist of fins, a porous layer or even an etched surface. The maximum boiling heat transfer coefficient can be limited in this device because there are a finite amount of nucleation sites, and therefore, a limited length of solid/liquid/vapor contact, where the heat transfer rate is the highest.

In accordance with prior art, as represented in FIG. 1, the liquid tube 103 is routed at a lower elevation than the liquid 104 pool height inside the condenser 100. However, there are many situations that may arise that prevent the liquid tube 103 to be routed at a lower elevation. As shown in FIG. 2, there may be components 106 to avoid at a low elevation which require the liquid tube 103 to be routed above these components 106. In this situation, it is possible for all the liquid 104 in the system to be trapped on the condenser 100 side of the apex of the liquid tube 103. If this situation arises, the thermosyphon will experience a dry-out condition and cease to function properly.

There is a need, therefore for a thermosyphon in which the liquid can flow to the evaporator 101 under adverse conditions.

SUMMARY OF THE INVENTION

This invention is an advancement in thermosyphon technology intended for use, among other places, in electronics cooling applications. In various embodiments, a thermosyphon is configured with an evaporator and a condenser, with a vapor tube allowing vapor to flow between the evaporator and condenser and a liquid tube allowing liquid to flow between the condenser and the evaporator. A condenser liquid pool accumulates at the bottom of the condenser. The upper surface of the condenser liquid pool is the condenser liquid pool surface. The apex of the liquid tube is above the surface of the condenser liquid pool, thereby trapping vapor and preventing liquid from passing from the condenser to the evaporator.

The application of heat to the evaporator increases the total system internal temperature and pressure causing condensation of the vapor in the liquid tube. As the liquid level in the liquid tube increases above the lower interior surface of the apex of the liquid tube, the liquid tube is primed, thereby creating the pressure head needed to overcome the hydrodynamic losses inside the thermosyphon.

Embodiments of the present invention also allow for passive start-up in conditions where the initial distributions of liquid inside the system is not controlled as well as when vapor exists inside the liquid tube.

The foregoing has outlined rather broadly certain aspects of the present invention in order that the detailed description of the invention that follows may better be understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The present invention is directed to improved methods and systems for, among other things, thermosyphons. The configuration and use of the presently preferred embodiments are discussed in detail below. It should be appreciated, however, that the present invention provides many applicable inventive concepts that can be embodied in a wide variety of contexts other than thermosyphon. Accordingly, the specific embodiments discussed are merely illustrative of specific ways to make and use the invention, and do not limit the scope of the invention.

Figure 1:
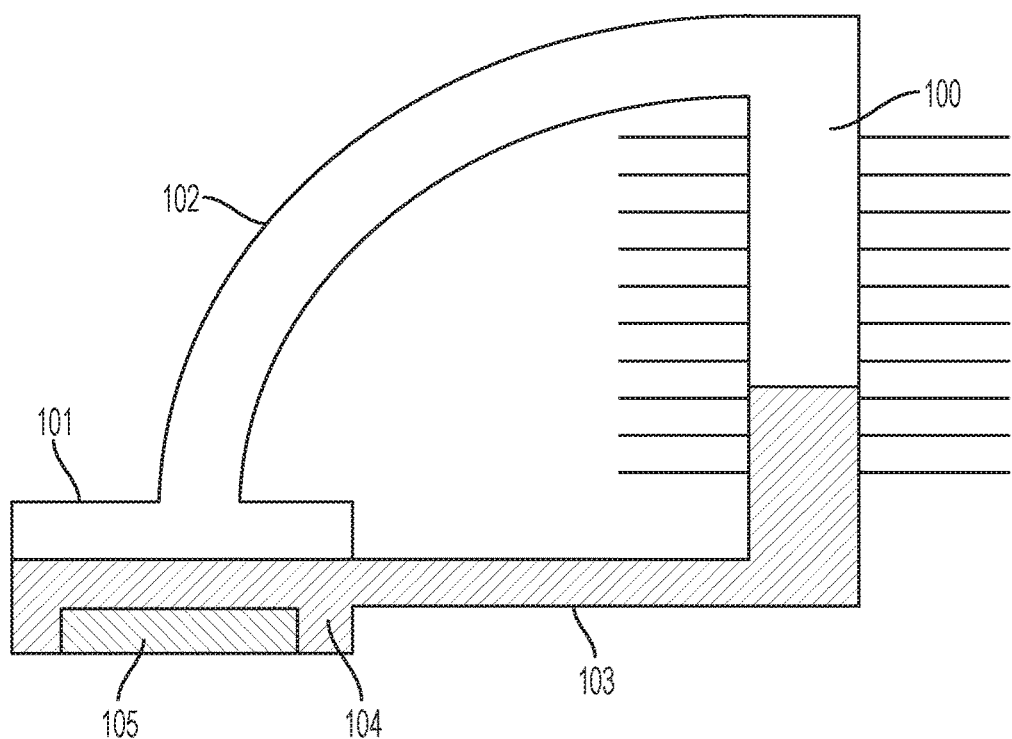
FIG. 1 is a schematic of thermosyphon design in accordance with prior art.
Figure 2:
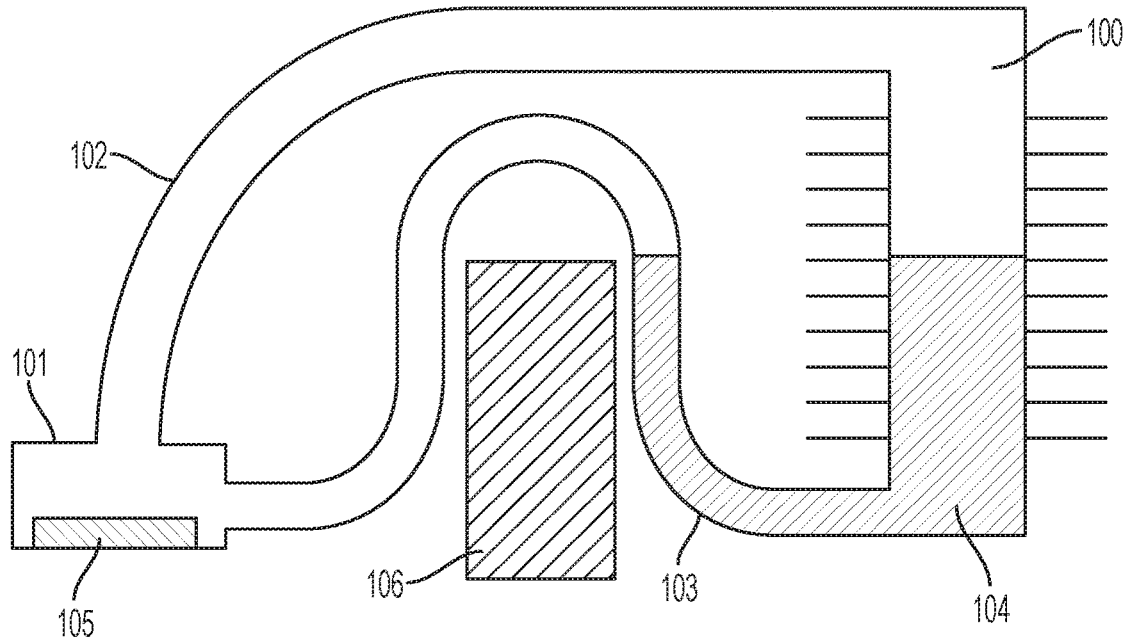
FIG. 2 is a schematic of a non-functioning thermosyphon.
Figure 3A:
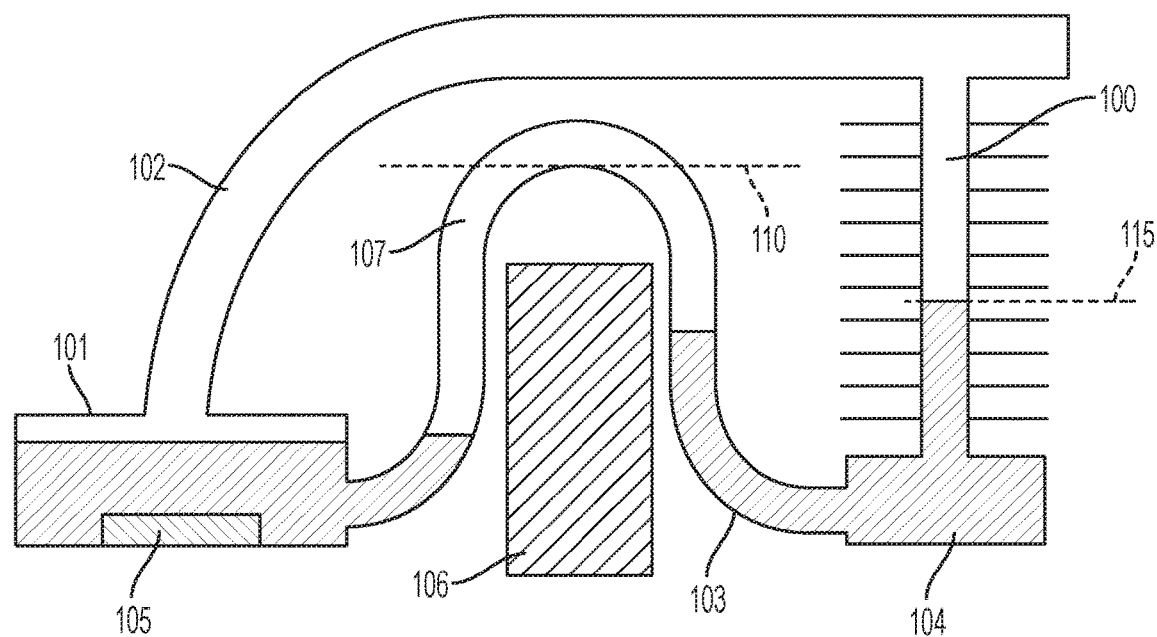
FIG. 3A is a schematic of a first embodiment of the present invention in an initial condition.

A first embodiment of the present invention is presented in FIG. 3A, during an initial condition. In this embodiment, the liquid tube 103 is routed above the liquid pool height 115 in the condenser 100, to avoid one or more components 106 that occupy some of the space between the condenser 100 and the evaporator 101. The liquid pool height 115 is defined by the height of the liquid pool surface inside the condenser 100. The liquid 104 fills the bottom of the condenser 100 and part of the evaporator 101, however the apex of the liquid tube 103, has trapped vapor 107 preventing liquid 104 from passing from condenser 100 to evaporator 101. Once heat is applied to the evaporator 101, vapor generated from an enhanced surface 105 flows into the vapor tube 102. The total system internal temperature and pressure will increase due to the heat input. As the temperature and pressure increases, the vapor 107 trapped in the liquid tube 103 will start to condense. There will be no liquid supply from the condenser 100 to the evaporator 101 until the liquid level in the liquid tube 103 increases past the lower interior surface 110 of the apex of the liquid tube 103.

Figure 3B:
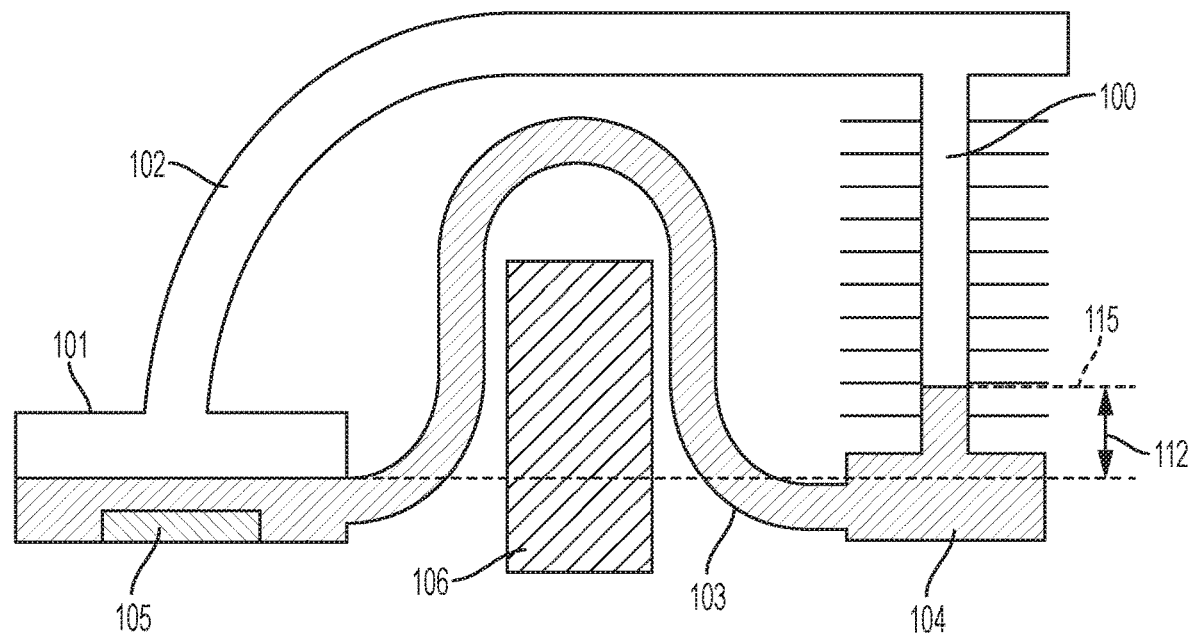
FIG. 3B is a schematic of a first embodiment of the present invention at a steady state condition.

Referring now to FIG. 3B, which shows that, once the liquid 104 level in the liquid tube 103 increases above the lower interior surface 110 of the apex of the liquid tube 103, the liquid tube 103 is primed. In a primed liquid tube 103, the static pressure head build up on either side of the apex in the liquid tube 103 directly offsets and the liquid pool height 115 difference 112 in the condenser 100 and the evaporator 101 create the pressure head needed to overcome the hydrodynamic losses inside the thermosyphon.

There are several items that a designer should consider in order to obtain consistent start-up. The first item is ensuring that there is liquid 104 in the evaporator 101 prior to start-up. The first method to ensure that this condition is met, is to tilt the system, prior to installation, so that liquid may flow into the evaporator 101. There may be many applications and conditions where installation instructions and start-up procedures may be too cumbersome to implement. In this case, the combined volume in the evaporator 101 and liquid tube 103, below and on the evaporator side of the apex 110 of the liquid tube 110 should be greater than the volume in the liquid tube 103 and condenser 100 below and on the condenser side of the apex 110 of the liquid tube 103. If the refrigerant charge is greater than the volume on the condenser side of the apex 110 in the liquid tube 103 and the condenser 100, then the liquid will pool inside the evaporator. In order to meet this condition, it can be beneficial to design a condenser 100 with minimum access volume, so that the internal volume in the evaporator 101 can be limited.

Figure 4:
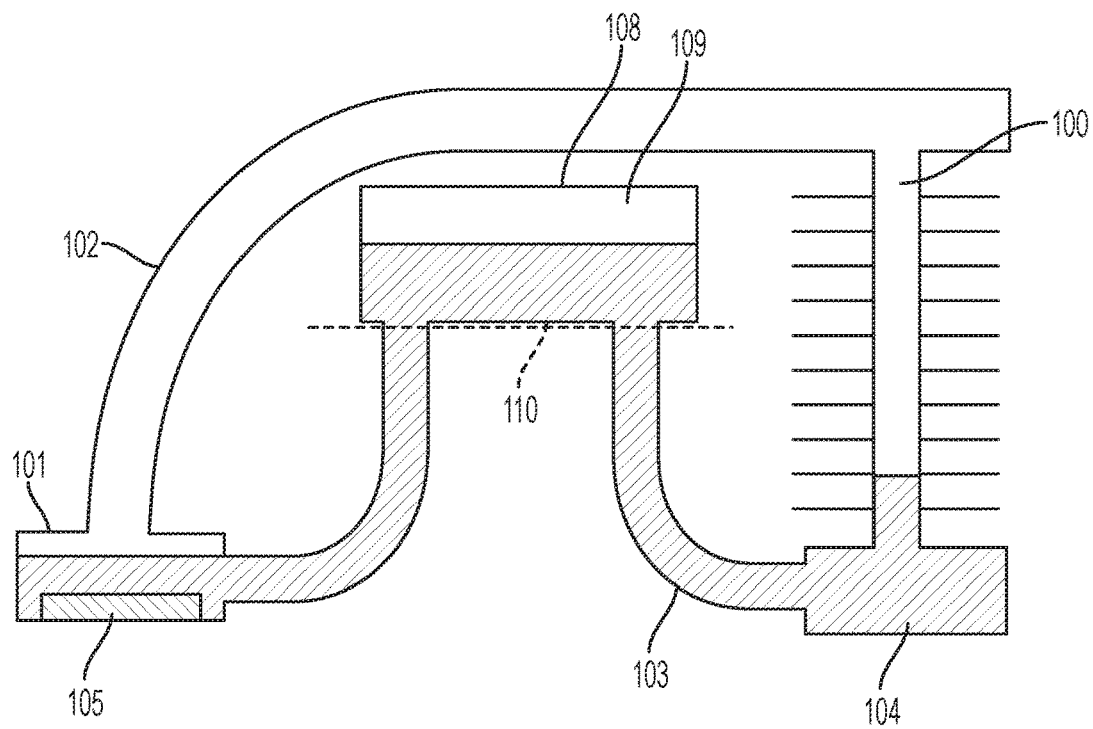
FIG. 4 is a schematic of a second embodiment of the present invention.

Referring now to FIG. 4 which depicts an alternative embodiment of the present invention. If the space around the evaporator 101 is constrained, a reservoir 108 may be added to the liquid tube 103 between the evaporator 101 and the condenser 100. If the space around the evaporator 101 is constrained, a reservoir 108 may be added to the liquid tube 103 between the evaporator 101 and the condenser 100. When a reservoir 108 is implemented, the volume of the evaporator 101 may be reduced. The location of the reservoir 108 can be at the apex 110 of the liquid tube 103 or on the evaporator 101 side of the apex 110. There may be vapor 109 in the reservoir 108 in steady state operation, with no detriment to the overall system performance.

Figure 5:
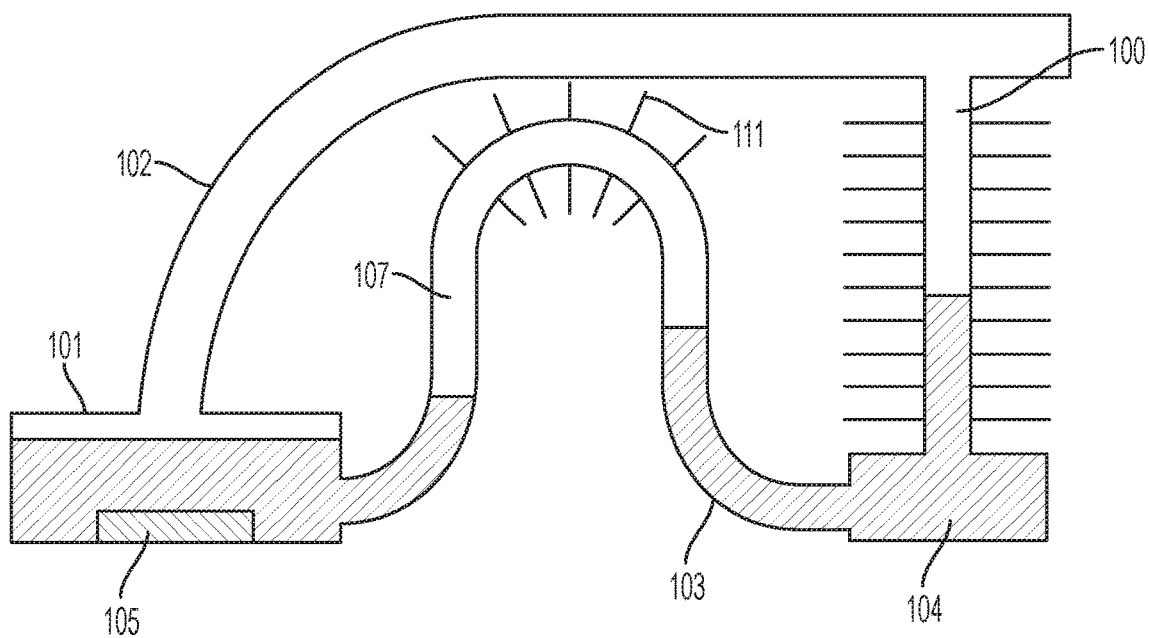
FIG. 5 is a schematic of a third embodiment of the present invention.

Referring now to FIG. 5, which shows yet another embodiment of the present invention. Those skilled in the art will appreciate that the rate of condensation in the liquid tube 103 must also be considered. The amount of liquid refrigerant in the evaporator 101, needs to be large enough to cover the time it takes for the vapor 107 in the liquid tube 103 to condense, and fully prime the liquid tube 103. The simplest method is relying on both the sub-cooled liquid and natural heat removal from a tube wall that has a temperature above the local ambient. However, the initial liquid mass in the evaporator 101 may be limited due to geometric constraints. In this scenario, it would be beneficial to shorten the priming time. As shown in FIG. 5, heat transfer fins 111 maybe be added to the apex 110 of the liquid tube 103, to accomplish this goal.

Figure 6:
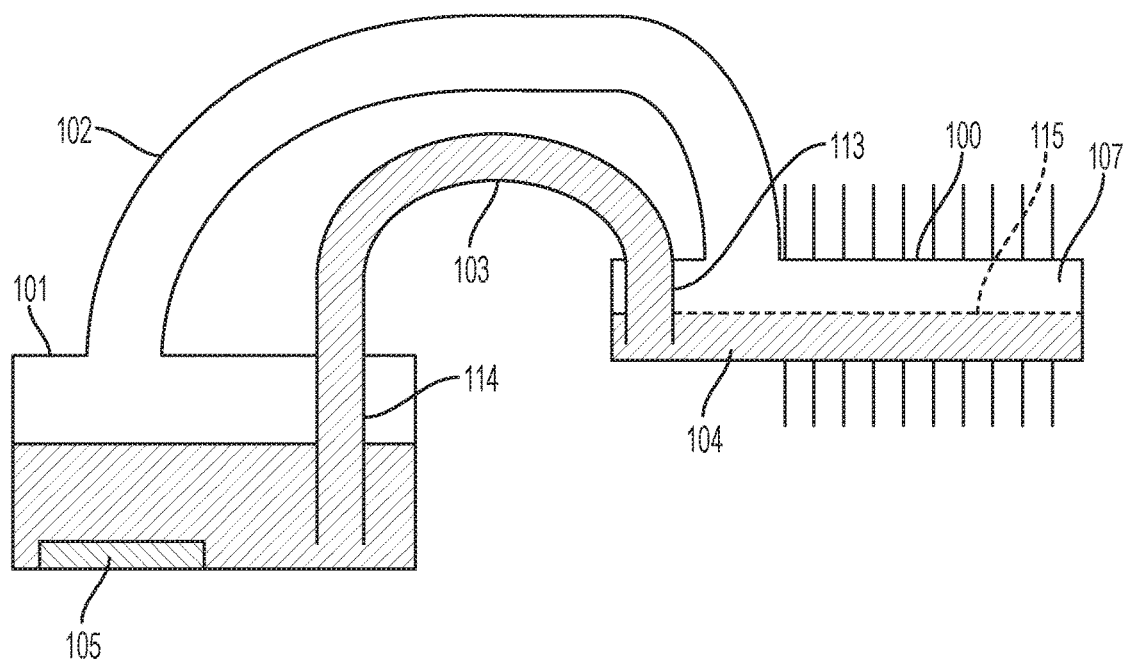
FIG. 6 is a schematic of a fourth embodiment of the present invention.

In the embodiments described thus far, the condenser 100 is in a substantially vertical orientation and the liquid tube 103, enters the evaporator 101 at a low point. However, it can be beneficial to have a condenser 100 that is substantially horizontally oriented for some applications. An embodiment of the present invention with a horizontally configured condenser 100 is presented in FIG. 6. In this embodiment, the liquid tube 103, connects the condenser 100 from the top side. In order to ensure liquid 104, and not vapor 107, flows through the liquid tube 103, a liquid tube extension 113 is submerged in the condenser's 100 liquid pool. If the liquid tube extension 113 is above the liquid pool height 115 in the condenser 100, the syphoning effect can be halted, leading to a dry-out condition in the evaporator 101.

Figure 7:
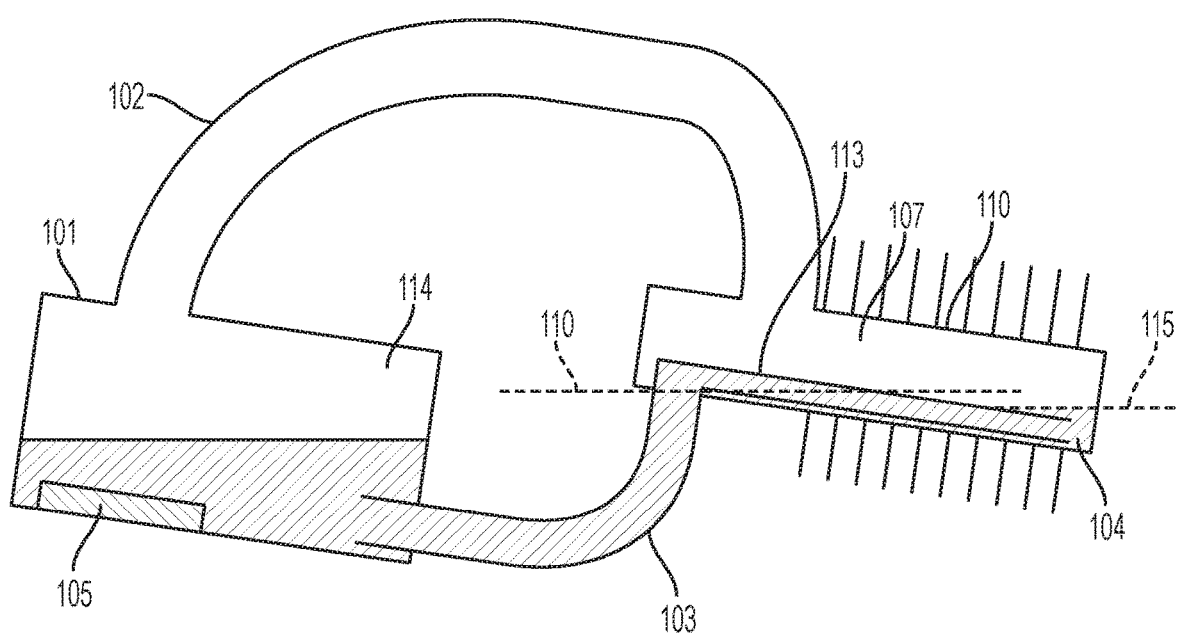
FIG. 7 is a schematic of another embodiment of the present invention.

In some situations where the condenser 100 has a substantially horizontal orientation, consideration of condenser tilt is important, as depicted in the embodiment in FIG. 7. If the condenser 100 is tilted in a manner that the liquid tube 103 entry point into the condenser 100 is at a relative high point, the liquid 104 will pool at the opposite end of the condenser 100, and the liquid pool height 115 will be below the apex 110 of the liquid tube 103. In the situation where the condenser 100 is tilted, the liquid tube 113 extension will need to extend into the liquid pool. The liquid tube extension 113, can be configured from channels made by fins, or by additional tubing inside the condenser 100. The main requirement is that the liquid tube extension 113 connect to the liquid tube 103, in a manner that the liquid flow path is continuous from the condenser 100 to the evaporator 101.

The working fluid has been described as a refrigerant, which is intended to represent any working fluid that changes phase from liquid to vapor when heat is applied. There are many suitable refrigerants, depending on operating temperatures and physical size limitations. Some suitable refrigerants include, but are not limited to, water, methanol, acetone, R134a, R1234ze, R1233ze, R245fa, sodium and ammonia.

There are further possible implementations of the present invention, where the evaporator is situated in a vertical orientation. One skilled in the art, may use the concepts from the aforementioned embodiments, to implement a substantially vertically mounted evaporator with a substantially vertical or substantially horizontal condenser.

While the present system and method has been disclosed according to the preferred embodiment of the invention, those of ordinary skill in the art will understand that other embodiments have also been enabled. Even though the foregoing discussion has focused on particular embodiments, it is understood that other configurations are contemplated. In particular, even though the expressions "in one embodiment" or "in another embodiment" are used herein, these phrases are meant to generally reference embodiment possibilities and are not intended to limit the invention to those particular embodiment configurations. These terms may reference the same or different embodiments, and unless indicated otherwise, are combinable into aggregate embodiments. The terms "a", "an" and "the" mean "one or more" unless expressly specified otherwise. The term "connected" means "communicatively connected" unless otherwise defined.

When a single embodiment is described herein, it will be readily apparent that more than one embodiment may be used in place of a single embodiment. Similarly, where more than one embodiment is described herein, it will be readily apparent that a single embodiment may be substituted for that one device.

In light of the wide variety of methods for thermosyphon known in the art, the detailed embodiments are intended to be illustrative only and should not be taken as limiting the scope of the invention. Rather, what is claimed as the invention is all such modifications as may come within the spirit and scope of the following claims and equivalents thereto.

None of the description in this specification should be read as implying that any particular element, step or function is an essential element which must be included in the claim scope. The scope of the patented subject matter is defined only by the allowed claims and their equivalents. Unless explicitly recited, other aspects of the present invention as described in this specification do not limit the scope of the claims.

I claim:

1. A thermosyphon, comprising:
an evaporator;
a condenser having a condenser liquid pool accumulated at a bottom thereof creating a condenser liquid pool surface;
a vapor tube fluidly coupling the evaporator to the condenser; and
a liquid tube fluidly coupling the condenser to the evaporator, wherein the liquid tube apex is above the condenser liquid pool surface.

2. The thermosyphon of claim 1, wherein a liquid tube extension inside the condenser extends the liquid tube inside the condenser.

3. The thermosyphon of claim 1, wherein a liquid tube extension inside the condenser allows fluid to flow from the liquid tube to the condenser liquid pool, and wherein the liquid tube enters the condenser from above the condenser.

4. The thermosyphon of claim 1, wherein a liquid tube extension inside the condenser allows fluid to flow from the liquid tube to the condenser liquid pool, and wherein the liquid tube enters the condenser from below the condenser.

5. The thermosyphon of claim 1, further comprising an evaporator liquid pool accumulated at the bottom of the evaporator, wherein an evaporator liquid tube extension allows fluid to flow from the liquid tube to the evaporator liquid pool.

6. The thermosyphon of claim 1, wherein a combined volume of space within the evaporator and liquid tube on the evaporator side of the liquid tube apex is greater than a combined volume of space within the condenser on the condenser side of the liquid tube apex.

7. The thermosyphon of claim 1, where the condenser is positioned horizontally.

8. A method of priming a thermosyphon, comprising:
transporting a vapor through a vapor tube fluidly connecting an evaporator to a condenser;
transporting a liquid through a liquid tube fluidly coupling the condenser to the evaporator;
accumulating a condenser liquid pool at the bottom of the condenser, the condenser liquid pool having a condenser liquid pool surface; and
positioning the liquid tube apex above the condenser liquid pool surface.

9. The method of claim 8, wherein a liquid tube extension inside the condenser extends the liquid tube inside the condenser.

10. The method of claim 8, wherein a liquid tube extension inside the condenser allows fluid to flow from the liquid tube to the condenser liquid pool, and wherein the liquid tube enters the condenser from above the condenser.

11. The method of claim 8, wherein a liquid tube extension inside the condenser allows fluid to flow from the liquid tube to the condenser liquid pool, and wherein the liquid tube enters the condenser from below the condenser.

12. The method of claim 8, further comprising an evaporator liquid pool accumulated at the bottom of the evaporator, wherein an evaporator liquid tube extension allows fluid to flow from the liquid tube to the evaporator liquid pool.

13. The method of claim 8, wherein a combined volume of space within the evaporator and liquid tube on the evaporator side of the liquid tube apex is greater than a combined volume of space within the condenser on the condenser side of the liquid tube apex.

* * * * *